United States Patent
Saiki et al.

(10) Patent No.: US 6,833,316 B2
(45) Date of Patent: Dec. 21, 2004

(54) SEMICONDUCTOR DEVICE INCLUDING A PAD AND A METHOD OF MANUFACTURING THE SAME

(75) Inventors: Takashi Saiki, Kawasaki (JP); Akira Yamanoue, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 94 days.

(21) Appl. No.: 10/278,939

(22) Filed: Oct. 24, 2002

(65) Prior Publication Data

US 2003/0057556 A1 Mar. 27, 2003

Related U.S. Application Data

(62) Division of application No. 09/988,268, filed on Nov. 19, 2001, now Pat. No. 6,518,669.

(30) Foreign Application Priority Data

Jun. 13, 2001 (JP) .......................................... 2001-178974

(51) Int. Cl.[7] .......................................... H01L 21/4763
(52) U.S. Cl. ........................ 438/622; 438/637; 438/675
(58) Field of Search ................................. 438/622, 637, 438/675; 257/758, 784

(56) References Cited

U.S. PATENT DOCUMENTS

| | | | |
|---|---|---|---|
| 5,287,002 A | 2/1994 | Freeman, Jr. et al. | 257/781 |
| 5,410,185 A | 4/1995 | Yeh | 257/776 |
| 5,834,845 A | 11/1998 | Stolmeijer | 257/752 |
| 6,016,008 A * | 1/2000 | Feldner | 257/751 |
| 6,373,136 B2 | 4/2002 | Otsuka et al. | 257/758 |

FOREIGN PATENT DOCUMENTS

| | | |
|---|---|---|
| JP | 1-251631 | 10/1989 |
| JP | 7-183345 | 7/1995 |
| JP | 11-150114 | 6/1999 |
| JP | 2000-150462 | 5/2000 |

* cited by examiner

*Primary Examiner*—Phat X. Cao
(74) *Attorney, Agent, or Firm*—Armstrong, Kratz, Quintos, Hanson & Brooks, LLP

(57) ABSTRACT

A semiconductor device includes a semiconductor substrate including semiconductor elements and an underlie wiring layer, an underlie insulating layer covering the underlie wiring layer; via conductors filled in via holes extending through the underlie insulating layer and reaching the underlie wiring layer, an insulating stack layer formed on the underlie insulating layer, covering the via conductors, the insulating stack layer including a first and a second insulating layer having different etching characteristic, a pad groove formed through the insulating stack layer, defining a pad region in which the via conductors are exposed, the pad region including therein at least an etching enhancing remaining insulation layer pattern; and a pad conductor filled in the pad groove.

4 Claims, 12 Drawing Sheets

(C)

(D)

SEMICONDUCTOR DEVICE INCLUDING A PAD AND A METHOD OF MANUFACTURING THE SAME

This application is a DIV of Ser. No. 09/988,268 filed Nov. 19, 2001, U.S. Pat. No. 6,518,669.

This application is based on and claims priority on Japanese Patent application No. 2001-178974, filed on Jun. 13, 2001, the whole contents of which are incorporated herein by reference.

BACKGROUND OF THE INVENTION

1. Field of the Invention

The present invention relates to a semiconductor device and a method of manufacturing the same, and in particular, to a semiconductor device including a pad of damascene structure and a method of manufacturing the same.

2. Description of the Related Art

The design rule of semiconductor devices becomes finer as the integration density thereof increases. A technical limit is appearing in a method in which after a surface metallic wiring layer of aluminum, wolfram(tungsten), or the like is deposited on a surface of an insulating layer, a resist pattern is formed on the surface metallic wiring layer and then the wiring layer is directly etched.

In place of the method to pattern the surface wiring layer by etching, a damascene process is increasingly used to embed wiring material in wiring grooves and via holes formed by an etching process in a beforehand prepared inter-level insulating layer. The damascene process is suitable to form a narrow wiring layer surrounded by silicon oxide layers.

Aluminum primarily used as wiring material in the prior art is limited with respect to resistance and electro-migration. Thanks to low resistance and a higher limit for the electro-migration, copper is increasingly used. It is difficult to pattern a copper layer by etching. However, copper wiring can be formed by a damascene process.

The known damascene processes include a single damascene process to form a via conductor and a wiring pattern conductor respectively in different processes and a dual damascene process in which a via hole and a wiring groove are first formed and a via conductor and a wiring pattern conductor are formed therein in one process.

A semiconductor integrated circuit device includes pads on its surface for connection thereof to another device. Since wiring is formed by the damascene process, the pad is formed also by the damascene process today.

Referring to FIGS. 6A to 6H, description will be given of a method of forming a single-damascene pad in the prior art. When copper is used as wiring material, for preventing oxidation of an underlie wiring layer in the ashing of a photo resist pattern, it is necessary to use an etching stopper layer of silicon nitride (SiN) or the like having an anti-oxidation function and an etching stopper function. An example of processes of manufacturing a pad section will be described by referring to the drawings.

As shown in FIG. 6A, a lower insulating layer d1 is first formed on a lower wiring w1, via holes are formed in the lower insulating layer d1, and a lower via conductor v1 is formed in each via hole.

The lower via conductor v1 can be formed, for example, by plating a copper layer on a whole surface of an underlie structure and then conducting chemical and mechanical polishing (CMP) process on the plated surface.

As shown in FIG. 6B, an etching stopper layer sp is formed with a silicon nitride (SiN) layer of 70-nanometer (nm) thickness on the lower insulating layer d1 to cover the lower via conductors v1. An insulating layer dp of, for example, a silicon oxide film of 2000-nm thickness is formed on the etching stopper layer sp. When it is desired that the insulating layer has a low dielectric constant, silicon oxide including fluorine, porous silicon oxide, or the like is used.

The etching stopper layer sp and the insulating layer dp collectively have a function of an inter-level insulating film. However, the etching stopper sp is a layer for exhibiting functions of preventing oxidation of the via conductors v1 and of an etching stopper in the etching of the insulating layer dp, and the insulating layer dp primarily serves as an inter-level insulating film.

The dielectric constant of the etching stopper layer sp is higher than that of the insulting layer dp. By increasing thickness of the etching stopper layer sp, the etching stopper function and the oxidation preventive function can be improved. However, this increases capacitance between the wiring layers and hence hinders a high-speed operation of the semiconductor device. Therefore, the thickness of the etching stopper layer sp is desirably reduced to a necessary minimum value.

As shown in FIG. 6C, a photo resist pattern PR is formed on the insulating layer dp to define an opening for a pad. The pad opening is defined such that a surface of the lower via conductor v1 below the pad opening is exposed.

As shown in FIG. 6D, the insulating layer dp is etched using the photo resist pattern PR as an etching mask. By using, for example, a parallel plate plasma etching system, the layer dp is etched by dry etching in an atmosphere including $C_4F_8$ as a main etching gas. The etching proceeds faster in a peripheral region of the opening than in a central region thereof. As a result of the difference in the etching rate, an etching retardation region RT at a central region (or a sub-trench ST in edge section of the opening) is formed.

The sub-trench indicates a contour formed by the etching rate difference between the wiring edge region and the wiring central region in the etching of a groove for a wiring having a large width. Since the etching rate is higher in the wiring edge region than in the wiring central region, a contour of a groove appears in edge region. The central region becomes higher in level than the edge region.

FIG. 7A is a graph showing an example of a relationship between the etching rate of the wiring edge region and the wiring central region. The abscissa represents the wiring width in micrometers ($\mu$m) and the ordinate represents the etching rate in nanometers per minute (nm/min). As shown in FIG. 7A, while the etching rate is almost fixed in the wiring edge region regardless of the change in the wiring width, the etching rate in the wiring central region has a tendency to become lower as the wiring width increases.

For example, when the wiring width is 30 $\mu$m, the etching rate in the wiring edge region is about 380 nm/min and that in the central region is about 300 nm/min.

In the etching of a silicon oxide layer of about 2000-nm thickness, the etching rate is 380 nm/min in the wiring edge region, and hence 5.26 minutes are required for the just or complete etching of wiring edge region. In contrast therewith, since the etching rate of the wiring central region is 300 nm/min, a silicon oxide layer of 422-nm thickness still remains when the wiring edge region is just or completely etched.

As shown in FIG. 6E, when the etching is stopped in a state in which the sub-trench ST appearing in the pad edge section reaches the etch stopper sp, i.e. the insulating layer dp is just etched, the central portion of the insulating layer dp remains as a remaining pattern dpx. Then, the via conductors v1 below the pattern dpx will not be exposed.

When over-etching is performed to etch the silicon oxide layer completely, the etching stopper layer at the edge region is disadvantageously etched. Assume that deviation of the etching rate in a wafer is about 10%. Then, a period of time necessary to etch the silicon oxide film (2200-nm thickness in the wiring central region) is 6.7 minutes.

The 6.7-minute etching corresponds to the etching of a silicon oxide film of about 2787-nm thickness in the wiring edge region. This results in an over-etching thickness of 787 nm. Assume that a selection ratio between the silicon oxide film and the etching stopper layer is ten. Then, the etching stopper layer is etched up to a depth or thickness of 78.7 nm. If the etching stopper layer has a thickness of 70 nm, the etching stopper layer is completely etched and hence vanishes in the wiring edge region.

As shown in FIG. 6F, when the insulating layer dp of the pad central section is completely etched by the over-etching, etching of the sub-trench region ST further proceeds in the pad peripheral section and the etching stopper layer sp vanishes.

When the etching continues in the state in which the lower via conductors v1 is exposed, copper of the conductors v1 directly comes into contact with the etching gas (particularly, with fluorine in the gas) as shown in FIG. 6G.

When the via conductors of copper is exposed after the etching stopper zone vanishes, copper fluoride CP is produced on surfaces of the via conductors, for example, in a fluorine atmosphere of the etching gas.

Furthermore, copper oxide is produced on surfaces of the conductors of copper exposed by a subsequent resist ashing process in an oxygen atmosphere.

As shown in FIG. 6H, when the etching continues, top portions of the via conductors vanish in the pad peripheral section. The via conductors are retarded respectively in the via holes. When empty spaces L appear respectively in the upper portions of the via holes, it becomes difficult to embed an upper wiring layer in the via holes.

When this phenomenon takes place, a contact error may take place. As above, when it is desired to form an opening having a large area in an insulating layer, subsequent processes are adversely influenced by occurrence of the phenomenon of the sub-trench.

When it is desired to form a wide pad groove in a two-layer inter-level insulating layer including an etching stopper layer and an insulating layer in the single damascene process, the etching rate difference between the pad central section and the pat peripheral section easily causes insufficient contact between the pad conductor and the via hole conductor. A need therefore exists for a technique to efficiently form a wide pad groove having a large area.

SUMMARY OF THE INVENTION

It is therefore an object of the present invention to provide a pad capable of preventing the insufficient contact thereof to the lower wiring layer.

According to one aspect the present invention, there is provided a semiconductor device, comprising a semiconductor substrate including semiconductor elements, an underlie wiring layer formed over said semiconductor substrate, said underlie wiring layer including a wiring pattern; an underlie insulating layer formed on said semiconductor substrate, said underlie insulating layer covering said underlie wiring layer; a plurality of via holes extending through said underlie insulating layer and reaching said underlie wiring layer; a plurality of via conductors embedded respectively in said via holes; an insulating stack layer formed on said underlie insulating layer, said insulating stack layer covering said via conductors, said insulating stack layer including a first insulating layer having an etching characteristic and a second insulating layer having an etching characteristic different from that of said first insulating layer; a pad groove formed through said insulating stack layer, said pad groove defining a pad region in which said via conductors are exposed, said pad region including therein at least an etching enhancing remaining insulation layer pattern; and a pad conductor filled in said pad groove.

According to another aspect the present invention, there is provided a semiconductor device manufacturing method, comprising the steps of (a) forming pad lower conductor structure over a semiconductor substrate, said pad lower layer conductor structure comprising an underlie layer and lower via conductors embedded in said lower insulating layer, (b) forming an insulating stack layer on said pad lower layer conductor structure, said insulating stack layer including a first insulating layer having an etching characteristic and a second insulating layer having an etching characteristic different from that of said first insulating layer, (c) forming an etching mask on said insulating stack layer, said etching mask defining a pad region and a remaining pattern in the vicinity of said lower via conductor in said pad region, (d) etching said insulating stack layer using said etching mask as a mask and forming a pad groove in which said lower via conductors are exposed, and (e) embedding a pad conductor in said pad groove.

Also when a wiring layer is again formed as a re-wiring layer on a pad once completely formed, a technique similar to the technique described above can be employed.

In the etching process, polymer is deposited while the etching is being conducted. When a large amount of polymer is deposited, the etching rate decreases. When a small amount of polymer is deposited, the etching rate increases.

FIG. 7B simply shows a state of a groove pattern edge section. Assume that a solid angle at a point on a bottom surface of the edge section is $\Omega a$, wherein the solid angle is schematically defined using the point on the bottom surface and two upper points defined by a photo resist pattern or the like as shown in FIG. 7B.

As shown in FIG. 7C, assume that a solid angle at a point on a bottom surface of the groove pattern central section is $\Omega b$, wherein the solid angle is schematically defined using the point on the bottom surface and upper points defined by a photo resist pattern or the like as shown in FIG. 7C. As can be seen from FIGS. 7B and 7C, the solid angle $\Omega a$ is less than the solid angle $\Omega b$.

Assume, for example, the groove has a depth of 1 (part) and a width of 2 (parts). The solid angle from an edge section of the groove is about 63° and that from a central section of the groove is about 90°.

In the groove central section with the larger solid angle, a large amount of polymer is deposited and the etching rate decreases.

In contrast therewith, in each groove edge section with the smaller solid angle, a small amount of polymer is deposited and the etching rate increases.

FIG. 7D is a graph schematically showing a relationship between the solid angle and the etching rate. The graph qualitatively shows a phenomenon in which the etching rate decreases when the solid angle from a point of a surface being etched increases.

By adjusting the contour of the mask to form a remaining or residual pattern of the insulating film in the pad region, a desired etching speed can be guaranteed in the etching of a region having a large area. Therefore, a favorable electric contact can be established at least in a region of the pad to be brought into contact with the lower conductor.

Even when the sub-trench phenomenon occurs, the insufficient contact with the lower conductor layer can be prevented.

BRIEF DESCRIPTION OF THE DRAWINGS

The objects and features of the present invention will become more apparent from the consideration of the following detailed description taken in conjunction with the accompanying drawings in which:

FIGS. 7A to 7D are diagrams illustrating the sub-trench phenomenon in which FIG. 7A is a graph, FIGS. 7B and 7C are schematic cross-sectional views, and FIG. 7D is a graph.

DESCRIPTION OF THE PREFERRED EMBODIMENTS

Figure 1A:
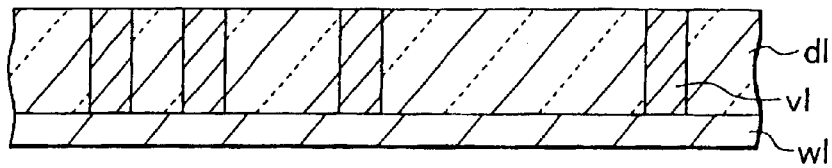
FIGS. 1A to 1G are cross-sectional views for explaining processes for manufacturing a semiconductor integrated circuit device according to an embodiment of the present invention.

Referring now to the drawings, description will be given of embodiments of the present invention.

Figure 2A:
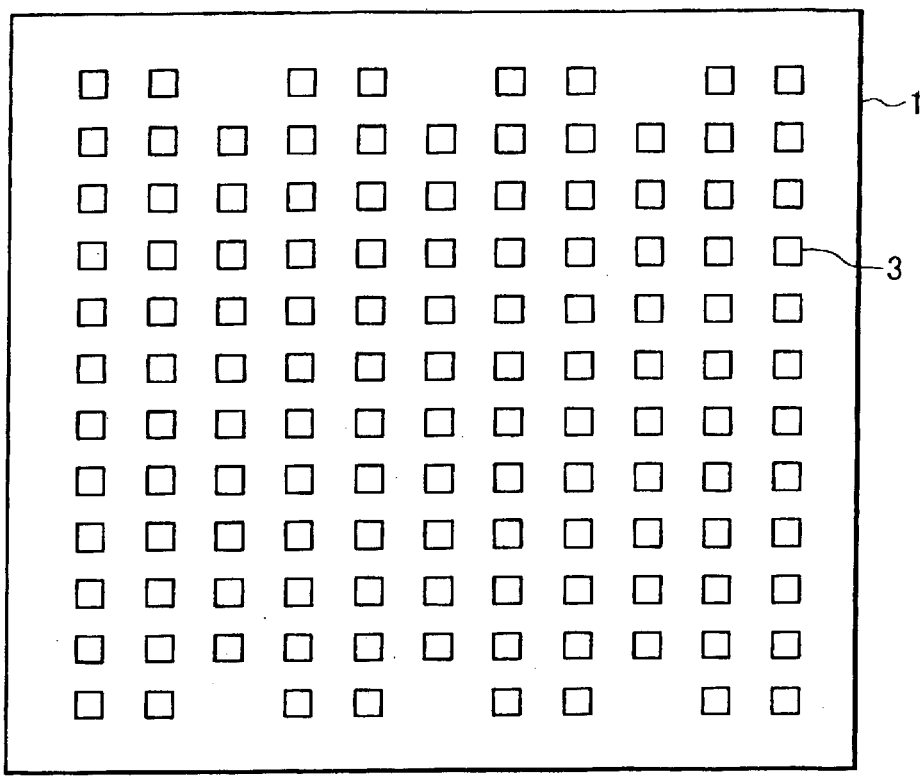
FIGS. 2A and 2B are plan views showing an example of a configuration of an upper surface of a semiconductor integrated circuit device.

FIG. 2A shows an example of a configuration of an upper surface of a semiconductor integrated circuit chip. After a large number of semiconductor elements are formed in a silicon chip 1, multi-layer wiring is formed on an associated surface of the silicon chip 1 and then a large number of pads 3 are arranged in an upper-most surface of the silicon chip 1. The pads 3 are disposed to connect terminals of the semiconductor integrated circuit device to external devices.

Figure 2B:
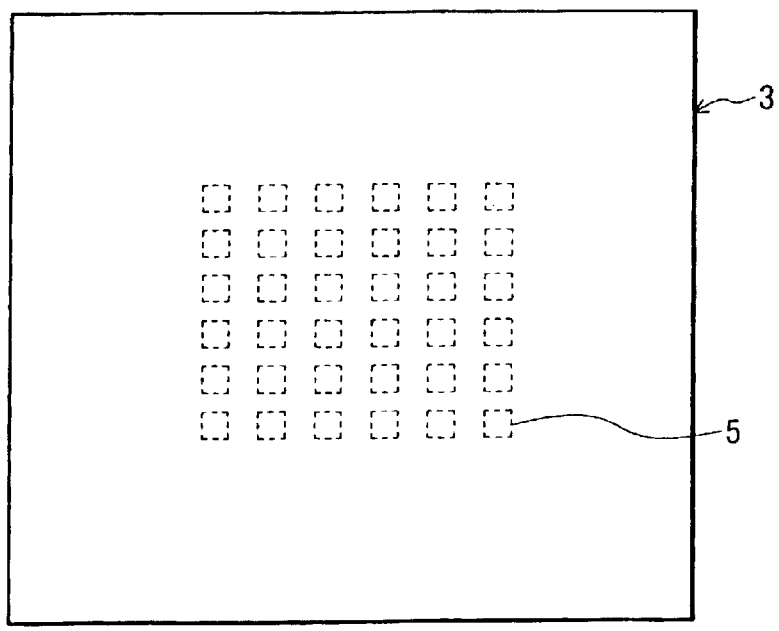

FIG. 2B is a top view showing an example of a configuration of the pad 3. The pad 3 includes a large number of via conductors 5 in a lower section thereof. The pad 3 has a contour of a square or a rectangle of which one edge is, for example, 30 µm or more. When the via conductors 5 are connected to the lower wiring, the pad 3 is connected with low resistance to the semiconductor integrated circuit device.

Figure 3A:
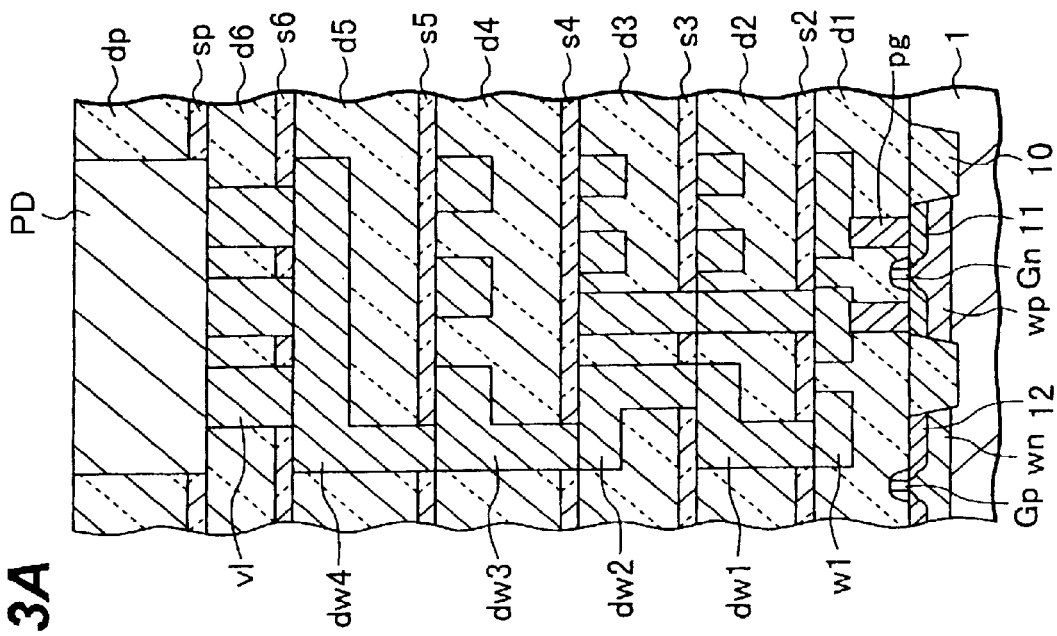
FIG. 3A is a cross-sectional view showing an example of a cross-sectional configuration of a semiconductor integrated circuit device.

FIG. 3A is a cross-sectional view showing an example of a cross-sectional configuration of a semiconductor integrated circuit device. In a surface section of a semiconductor substrate 1 made of silicon or the like, device isolation regions 10 are formed, for example, by shallow trench isolation (STI) process to define active regions.

In FIG. 3A, a p-type insulated gate electrode Gp is formed on a surface of a region in which an n-type well wn is formed, and p-type source/drain regions 12 are formed on both sides of the p-type insulated gate electrode Gp to collectively constitute a p-channel metal-oxide-semiconductor (MOS) transistor. An n-type insulated gate electrode Gn is formed on a surface of a region in which an p-type well wp is formed, and an n-type source/drain regions 11 are formed on both sides of the n-type insulated gate electrode Gn to collectively construct an n-channel metal-oxide-semiconductor(MOS) transistor.

Plugs pg and first wiring layers w1 are formed in an insulating layer d1 of a silicon oxide layer or the like on the surface of the silicon substrate 1. The plug pg is made of, for example, wolfram. The first wiring layer w1 is, for example, a copper layer.

For example, after depositing a lower section of the insulating layer d1, a contact hole is formed and is then filled with wolfram. A wolfram layer deposited on the surface is removed, for example, by CMP process. After a remaining section of the insulating layer d1 is deposited and a wiring groove is formed, the groove is filled with a copper layer. The copper layer deposited on the surface is removed by CMP or the like in the same way as above.

After the copper wiring is formed, an etching stopper layer s2 is formed on a surface of the insulating layer d1. The etching stopper layer is, for example, a silicon nitride (SiN) layer of 50-nm thickness. An insulating layer d2 of silicon oxide or the like is formed on the etching stopper layer s2.

Etching process is performed on the surface of the insulating layer d2 to form wiring grooves and via holes and selected surface of the first wiring layer w1 is exposed. Thereafter, the wiring grooves and the via holes are filled with a copper layer to form a dual damascene wiring layer dw1. After the copper layer or the like deposited on the surface of the insulating layer d2 is removed, an etching stopper layer s3 and an insulating layer d3 are deposited on a surface of the insulating layer d2. Through processes similar to those described above, wiring grooves and via holes are formed in the insulating layer d3 and the etching stopper layer s3 to form a second dual damascene wiring layer dw2.

An etching stopper layer s4 and an insulating layer d4 are formed through similar processes, and then a third dual damascene wiring layer dw3 is formed to be embedded in the inter-level insulating layer. An etching stopper layer s5 and an insulation layer d5 are formed on the wiring layer dw3 to fabricate a fourth dual damascene wiring layer dw4 to be embedded in the inter-level insulating layer.

An etching stopper layer s6 and an insulation layer d6 are formed on a surface of the insulating layer d5, and via holes are formed in the insulating layer d6 and are then filled with via conductor v1. The via conductor v1 is made of, for example, copper. After the via conductor v1 is formed, an etching stopper layer sp and an insulation layer dp are formed on a surface of the insulating layer dp to cover surfaces of the via conductors v1. A pad groove is formed in the insulating layer dp to expose surfaces of the via conductors v1. The pad groove is filled with a copper layer, and then an unnecessary portion of the copper layer on the surface of the insulating layer dp is removed to resultantly form a pad conductor PD.

In this way, a semiconductor integrated circuit device including multilayer wiring is fabricated.

Figure 3B:
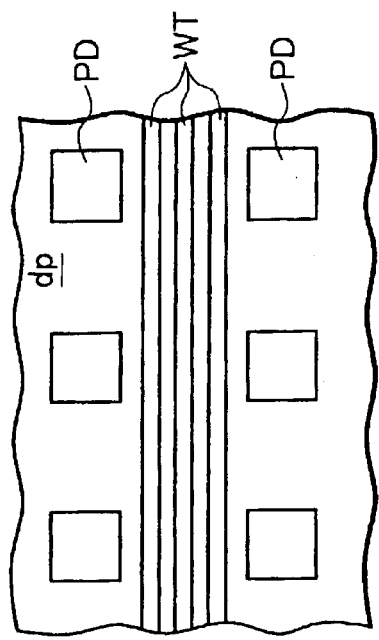
FIGS. 3B and 3C are partial plan views showing an upper configuration of the a semiconductor integrated circuit device.

FIG. 3B is a top view schematically showing a surface layout. Pads PD are embedded in the insulating layer dp. Upper wiring WT is formed between two groups of the pads. The pads PD and the wiring WT is formed in a single damascene process.

Figure 3C:
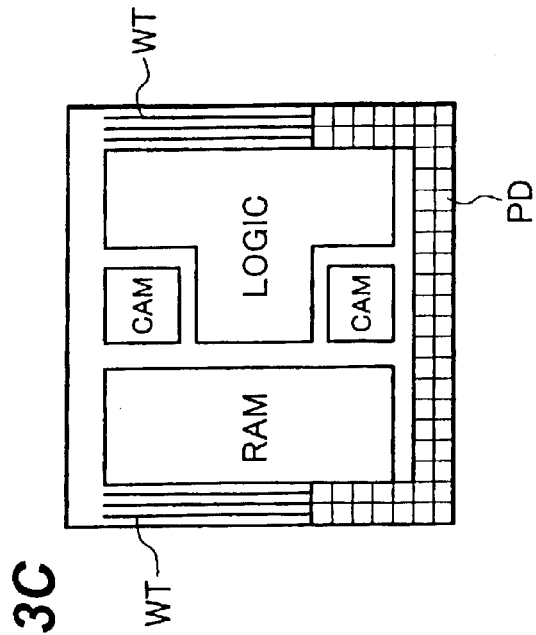

FIG. 3C is a plan view showing an example of an upper surface layout of the entire semiconductor chip. A memory circuit RAM, a logic circuit LOGIC, cam circuits CAM, and the like are arranged in an internal region of the semiconductor chip. The pads PD and the wiring WT, and the like are formed in peripheral regions.

Description will next be given of an embodiment of the present invention. The configuration of the pad will be described, and hence description of lower layer structure will be avoided.

As shown in FIG. 1A, after lower wiring w1 is formed, a lower insulating layer d1 is formed on a surface of the lower wiring w1. When the lower wiring w1 is formed using a copper layer, the lower insulating layer d1 is formed as a stack of an etching stopper layer and an insulating layer.

A via hole is formed at predetermined positions in the lower insulating layer d1, a barrier metallic layer is deposited, for example, by sputtering, and then a copper seed layer is formed by sputtering. A copper layer is plated on the via holes to form via conductors v1. The copper and the barrier layers deposited or plated on the surface of the insulating layer d1 are removed by CMP process or the like.

Figure 1B:
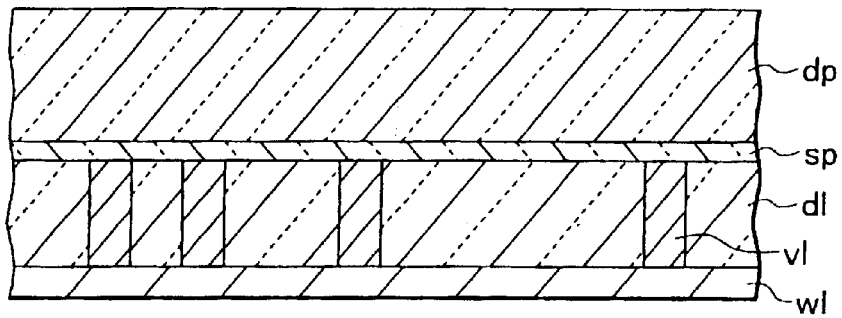

As shown in FIG. 1B, an etching stopper layer sp and an insulating layer dp are deposited on the lower insulating layer d1 to cover the lower via conductors v1. For example, a silicon nitride (SiN) layer of 70-nm thickness is deposited as the etching stopper layer sp. For example, a silicon oxide layer of 2000-nm thickness is deposited as the insulating layer dp.

Figure 1C:
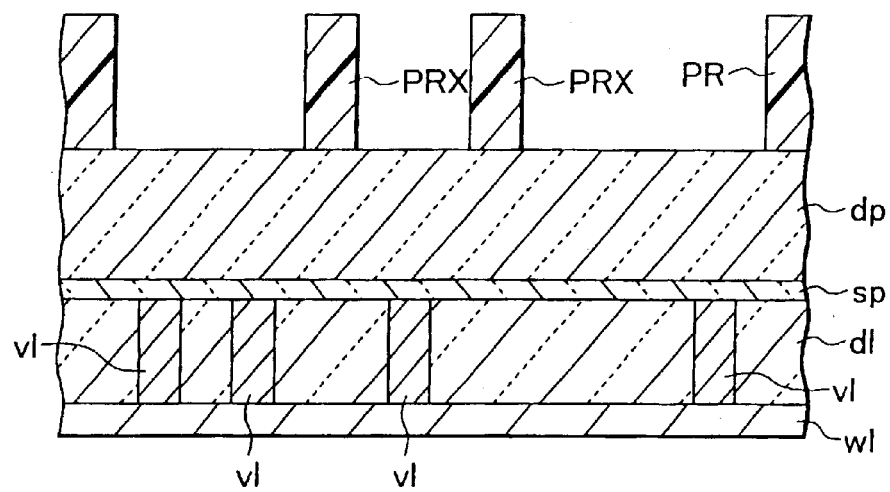

As shown in FIG. 1C, a photo resist pattern PR is formed on the lower insulating layer dp. The photo resist pattern PR has openings which define pad areas. The pattern PR further has resist pattern or pattern for forming edge region in the pad opening. The resist patterns PRX are distributed such that the distance between each via conductor v1 and a sidewall of the insulating layer dp is equal to or less than 1 μm.

In the configuration of FIG. 1C, two via conductors v1 in the central region are apart from sidewalls of the pad groove. These via conductors v1 are disposed in a region in which the etching is delayed by the sub-trench phenomenon if the resist patterns PRX are not formed. By forming an edge within 1 μm or less, the central region of the pad groove becomes virtually equivalent to the edge region of the pad groove.

Figure 1D:
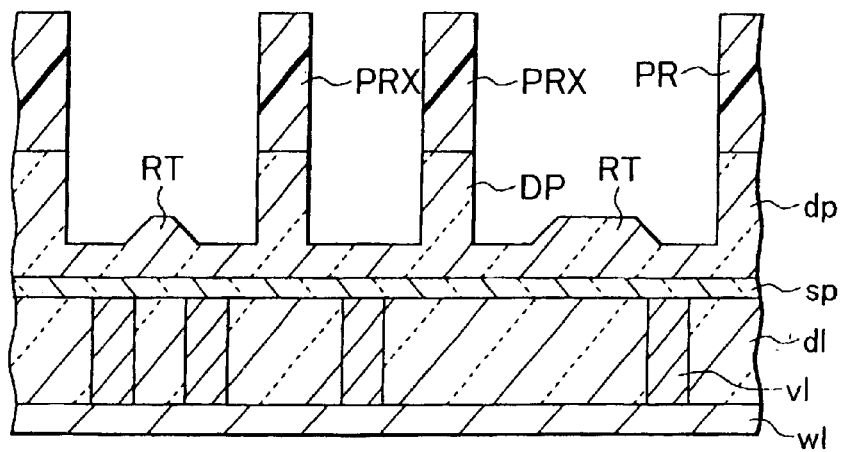

As shown in FIG. 1D, the insulating layer dp is etched using the photo resist pattern PR (PRX) as an etching mask. For this purpose, dry etching is performed in an atmosphere including $C_4F_8$ as a primary etching gas in, for example, a parallel plate plasma etching system. Due to the sub-trench phenomenon, the etching rate is high in the edge sections in contact with the photo resist pattern and is low in the central section apart from the photoresist pattern or the edge sections. This resultantly forms a projected region RT.

Figure 1E:
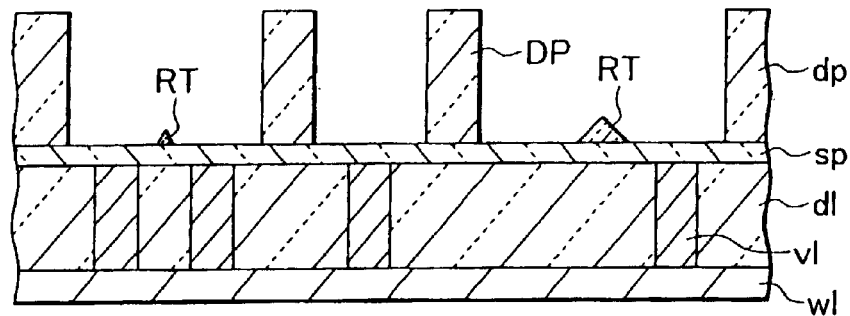

FIG. 1E shows a state in which the etching including the over-etching has been finished for the insulating layer dp. In a primary area in which the pad is to be formed, the insulating layer dp is etched and the etching stopper layer sp below the insulating layer dp is exposed. However, there is formed a remaining or residual pattern DP on which the resist pattern PRX existed in the pad region. In a region apart from the insulating layer dp and the remaining pattern DP, a portion RT of the insulating layer remains.

In this state, the etching stopper layer sp is removed, for example, by dry etching. In the region of the remaining portion RT of the insulating layer, the etching stopper layer sp also remains. In the region on the via conductor v1, the etching stopper layer sp is removed.

Figure 1F:
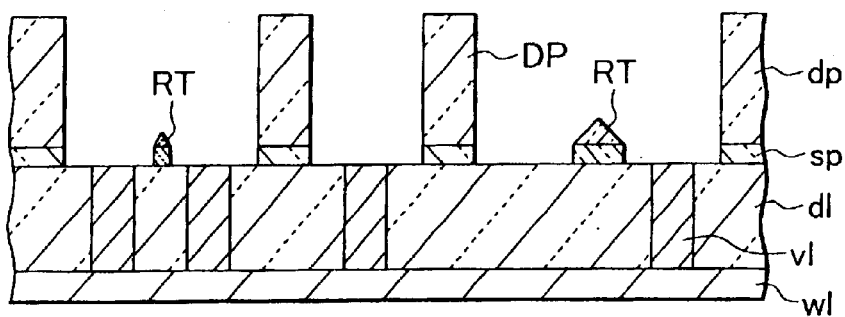

FIG. 1F schematically shows a contour of a pad groove formed in this way. The remaining insulating layer portion RT is formed above the region of the lower insulating layer d1 and hence does not hinder electric contact of the via conductor v1. The remaining pattern DP of the insulating layer is also formed above the region of the lower insulating layer d1 and hence does not hinder electric contact of the via conductor v1.

Figure 1G:
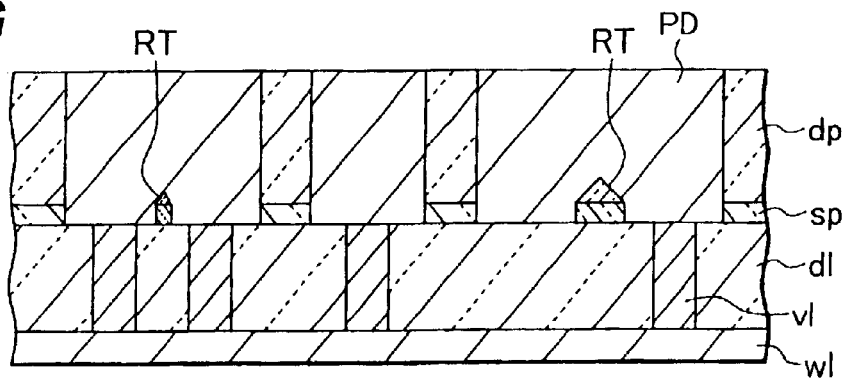

As shown in FIG. 1G, a barrier metal layer and a seed layer are formed in the pad groove, and a copper layer is plated thereon. Unnecessary portions of the conductive layers formed on the insulating layer dp are removed by CMP or the like to thereby fabricate a copper pad PD.

In forming the pad groove, the insulating layer pattern is intentionally left in some part of the pad area to produce the edge regions. This prevents the delay of the etching in the region of the pad groove and hence leads to sufficient contact of the pad with the via conductor below the pad.

In the method shown in FIGS. 1A to 1G, the etching seems to proceed substantially in the normal (vertical) direction, namely, in a direction from an upper end of FIG. 1 to a lower end thereof. However, in an actual etching process, the resist mask becomes gradually smaller and hence the etched sidewalls are usually tapered. Description will now be given of an embodiment positively using the phenomenon of the tapered sidewalls described above.

Figure 4A:
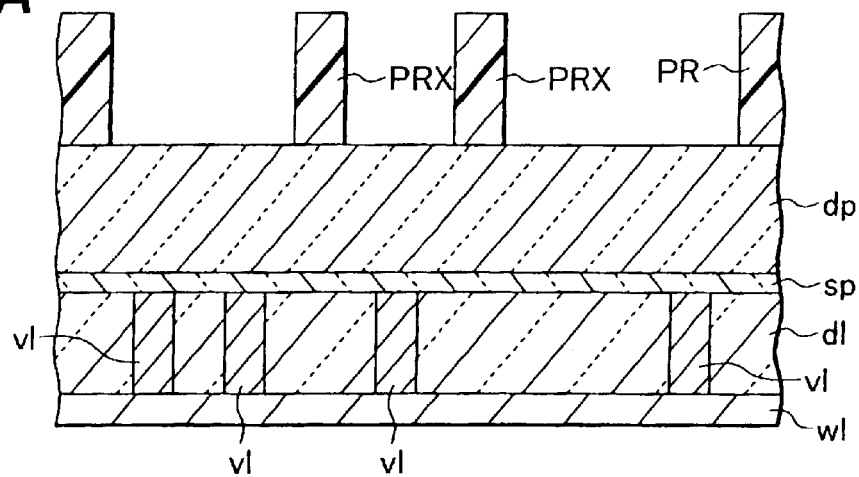
FIGS. 4A to 4F are cross-sectional views for explaining processes for fabricating a semiconductor integrated circuit device according to another embodiment of the present invention.

As shown in FIG. 4A, a configuration similar to that shown in FIG. 1C is formed. In this embodiment, the resist pattern PRX remained in the pad region is narrower than that shown in FIG. 1C.

Figure 4B:
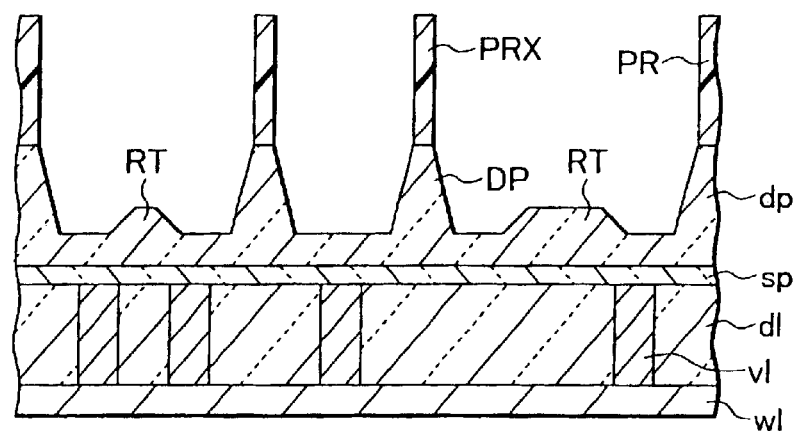

As shown in FIG. 4B, the insulating layer dp is etched using the resist patterns PR and PRX as an etching mask. Since the resist pattern PRX in the pad region provides an edge region, the etching rate is high also in a peripheral region of the resist pattern PRX as in the embodiment described above.

In this embodiment, the remaining pattern DP of the insulating layer below the resist pattern PRX is tapered, that is, the width of the resist pattern DP becomes larger as the position becomes low. As the etching proceeds, the size of the top edge section of the pattern DP decreases.

Figure 4C:
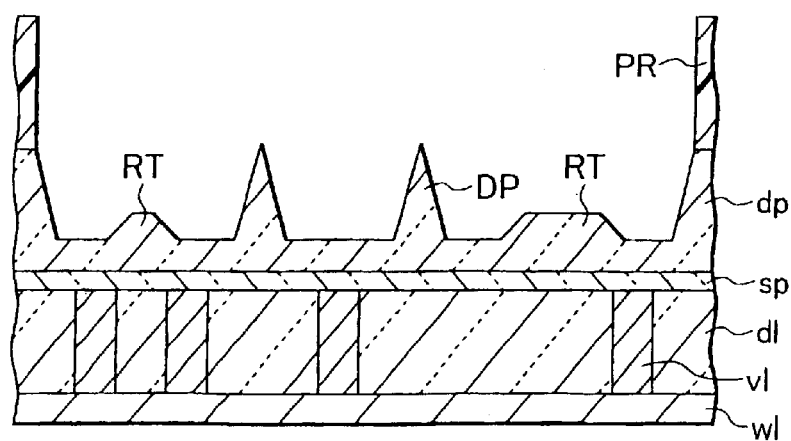

As shown in FIG. 4C, when the resist pattern PRX in the pad region vanishes, the remaining pattern DP of the insulating layer formed below the resist pattern PRX has a triangular cross section.

Figure 4D:
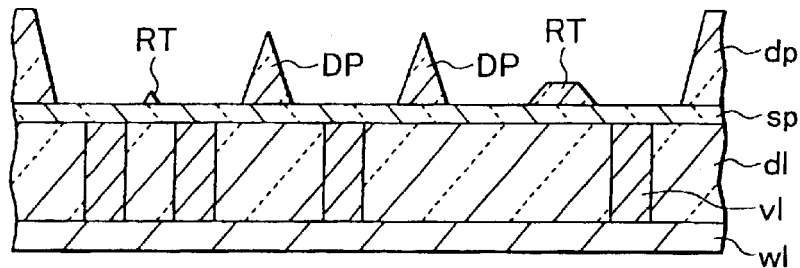

FIG. 4D shows a state in which the insulating layer dp has been completely etched in the main region. Since the edge region is additionally provided, the etching has been performed substantially in the overall region. However, a remaining pattern DP is formed in the remaining pattern region. The pattern DP is lower than the insulating layer dp surrounding the pattern. A remaining insulating layer RT exists in a region apart from the edge as in the embodiment described above. The etching stopper layer sp is removed in this state.

Figure 4E:
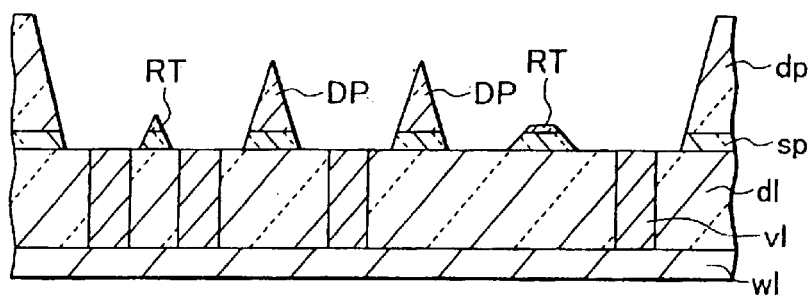

As shown in FIG. 4E, the exposed etching stopper layer sp is removed and the surface of the via conductors v1 is exposed. The remaining patterns DP and. RT kept remained in the pad region are disposed above the lower insulating layer d1 and hence does not hinder electric contact of the via conductors.

Figure 4F:
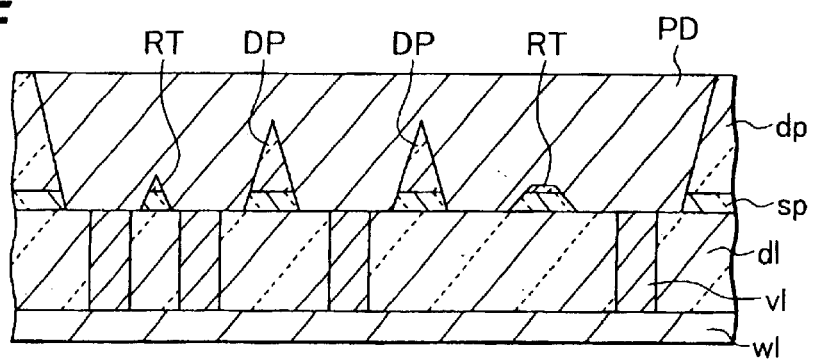

As shown in FIG. 4F, a pad PD is formed by sputtering, plating, or the like. The remaining patterns DP and RT of the insulator in the groove are embedded in the pad PD formed in the groove. That is, the insulator patterns DP and RT are not exposed at a surface of the metal pad PD, and hence the metal pad PD is exposed at the whole pad area.

In the embodiment shown in FIGS. 1A to 1G, part of patterns of the insulating layer are exposed in the pad area or are exposed at the surface of the pad, and hence the contact area is reduced to some extent. However, in this embodiment, the overall surface of the pad area is formed of a metal surface. This prevents reduction of the contact area.

In some cases, a wiring layer is further formed on a surface of the semiconductor integrated circuit device. For example, a re-wiring process for forming an aluminum re-wiring layer is performed on a surface of a copper pad formed as an upper-most layer of a semiconductor integrated circuit device. Such a re-wiring layer is used, for example, to serve as an aluminum pad or as a base for a bump.

Figure 5A:
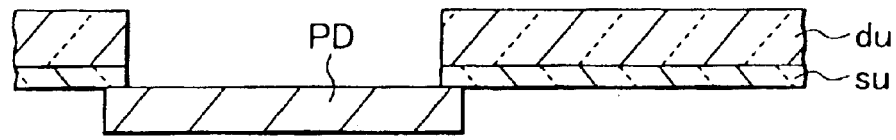
FIGS. 5A to 5J are cross-sectional views illustrating processes for fabricating a semiconductor integrated circuit device according to still another embodiment of the present invention.

FIG. 5A is a partial cross-sectional view for illustrating a surface configuration of a semiconductor integrated circuit device including a pad PD. An upper etching stopper layer su and an upper insulation layer du are formed on the pad PD with a window which exposes a surface of the pad PD. The pad PD is formed using, for example, of a copper layer.

Figure 5B:
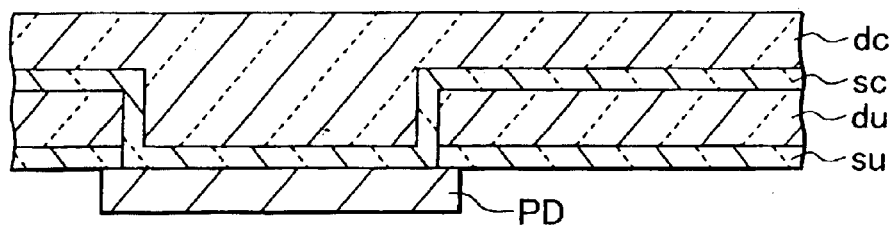

As shown in FIG. 5B, an etching stopper layer sc is deposited to cover the overall surface including the surface of the pad PD. An insulation layer dc is then formed on the etching stopper layer sc, and a surface of the insulating layer dc is planarized or smoothed. The insulating layer do is formed, for example, of spin-on glass or polyimide.

Figure 5C:
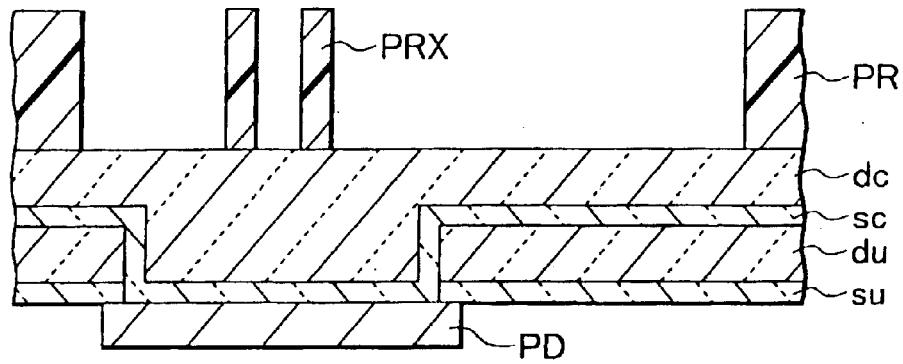

As shown in FIG. 5C, resist patterns PR and PRX are formed on the insulating layer dc. The resist pattern PR has a large opening in a pad region of a re-wring layer. The remaining resist patterns PRX are intentionally formed in the opening with a gap of 2 μm or less therebetween to provide an edge region within 1 μm from each pattern PRX as in the embodiments described above. The insulating layer dc is etched using the resist patterns PR and PRX as an etching mask.

Figure 5D:
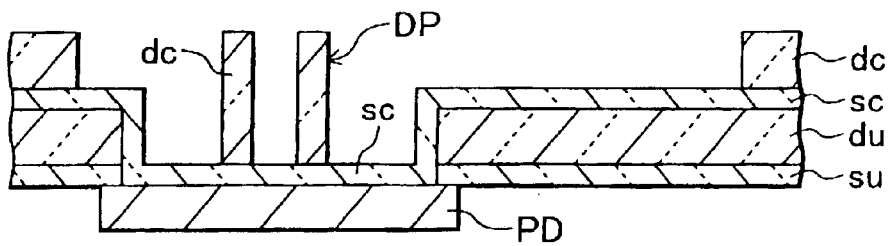

FIG. 5D shows a state in which the insulation layer dc has been completely etched. The resist patterns have been removed by ashing. The etching stopper layer sc protects the copper layer of the pad PD against an oxygen atmosphere. Since a remaining pattern DP is intentionally formed in the opening region in the etching of the insulating layer dc, the area in which the etching is retarded is reduced. Therefore, a desired contact area of the pad PD can be guaranteed.

Figure 5E:
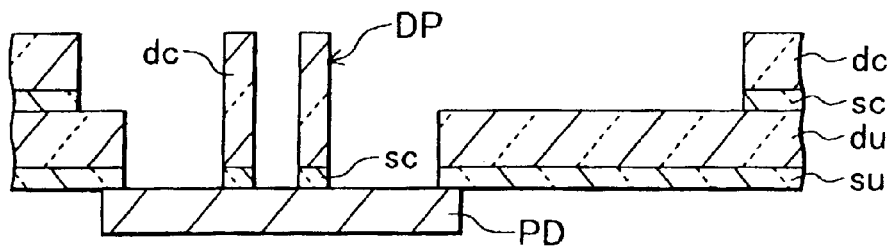

As shown in FIG. 5E, the exposed etching stopper layer sc is removed by dry etching process using the insulating layer dc as a mask. The remaining pattern DP is formed of the etching stopper layer sc and the insulating layer dc on the pad PD. The remaining pattern DP enhances the etching and increases the etching speed in its peripheral region and hence a primary area of the pad PD can be exposed with high reliability.

Figure 5F:
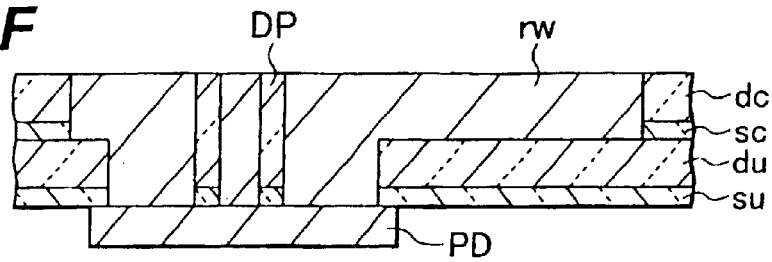

As shown in FIG. 5F, a re-wiring layer rw is formed in the groove formed as above, and then unnecessary portions are removed by CMP process or the like. In the configuration fabricated in this way, the re-wiring layer rw is brought into contact with the pad PD with low resistance.

Figure 5G:
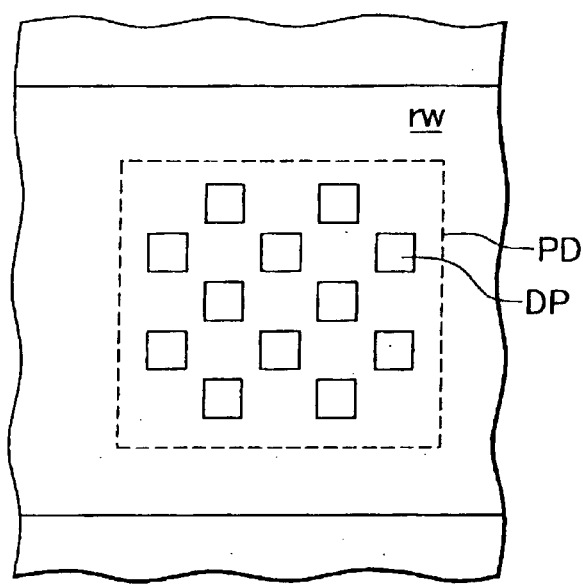

FIG. 5G shows, in a plan view, an example of the configuration including the lower pad PD, the remaining pattern PD of the insulation layer, and the re-wiring layer rw. The re-wiring layer rw serves, for example, as a base of a bump. The re-wiring layer rw is formed of aluminum, an aluminum alloy, copper, or the like.

Figure 5H:
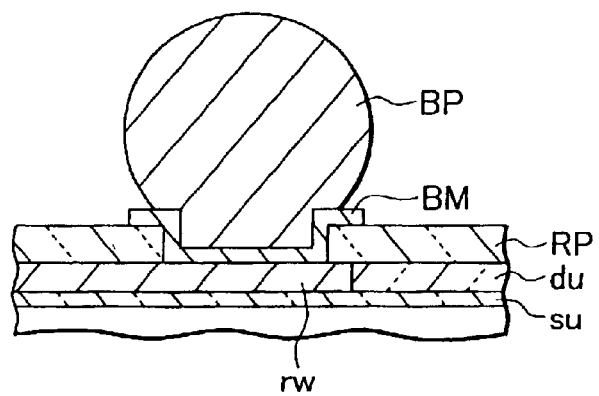

FIG. 5H shows a configuration example of a bump. A re-wiring protective layer RP is formed using polyimide or the like on the aluminum re-wiring layer thus formed. An opening is formed in the re-wiring protective layer RP to expose a surface of the re-wiring layer. A barrier metal layer BM is formed to cover the opening. A bump of solder or the like is disposed on the barrier metal layer BM.

Figure 5I:
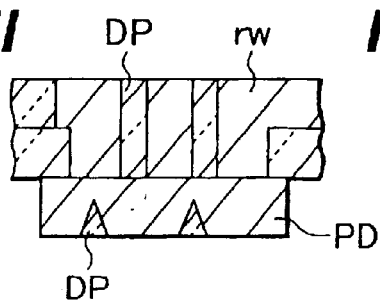
Figure 5J:
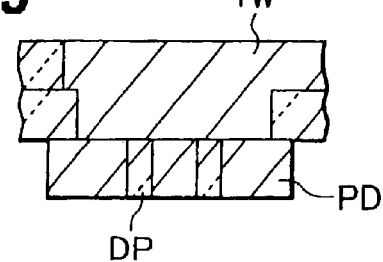
Figure 6A:
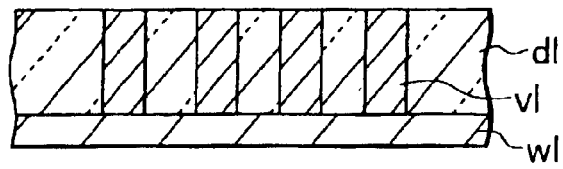
FIGS. 6A to 6H are cross-sectional views illustrating processes for fabricating a pad using a damascene process in the prior art.
Figure 6B:
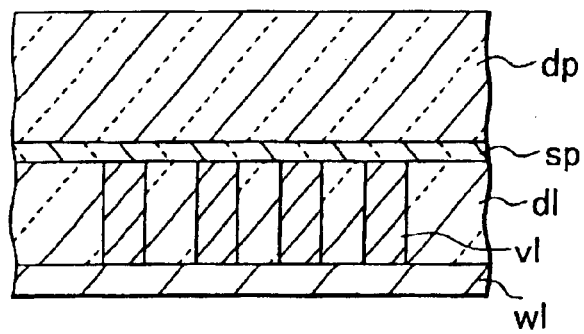
Figure 6C:
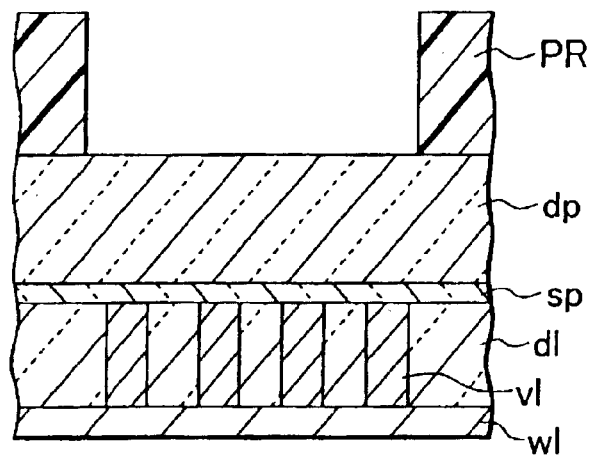
Figure 6D:
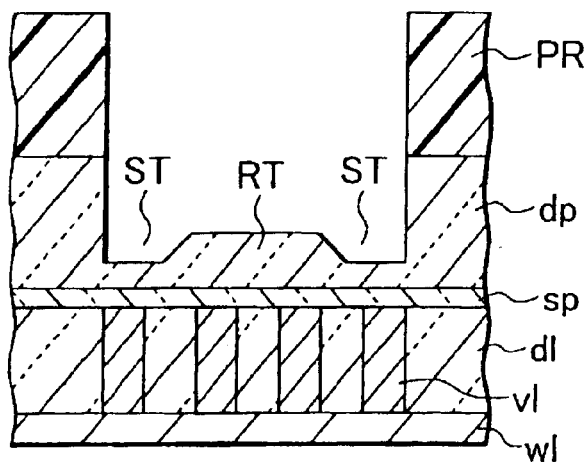
Figure 6E:
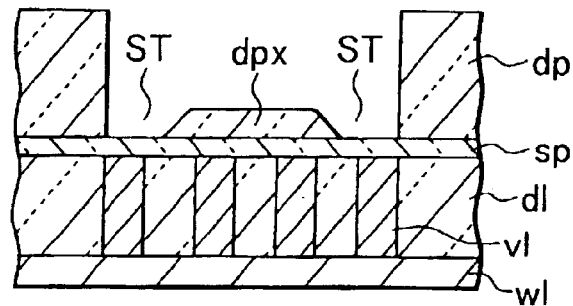
Figure 6F:
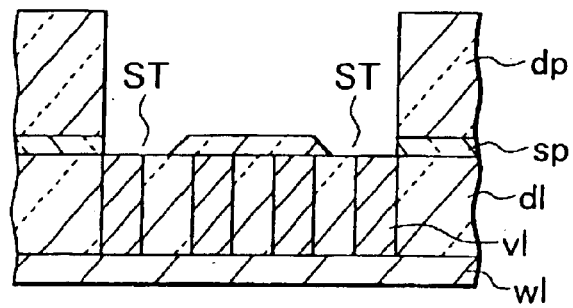
Figure 6G:
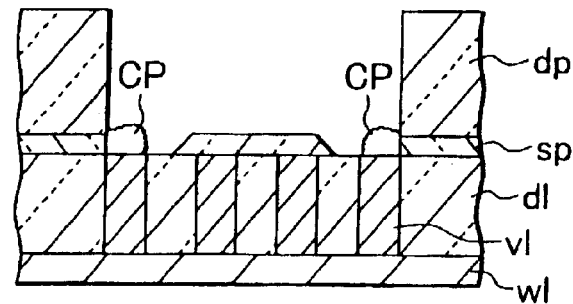
Figure 6H:
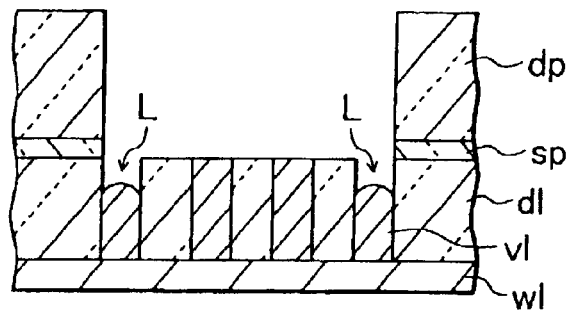
Figure 7A:
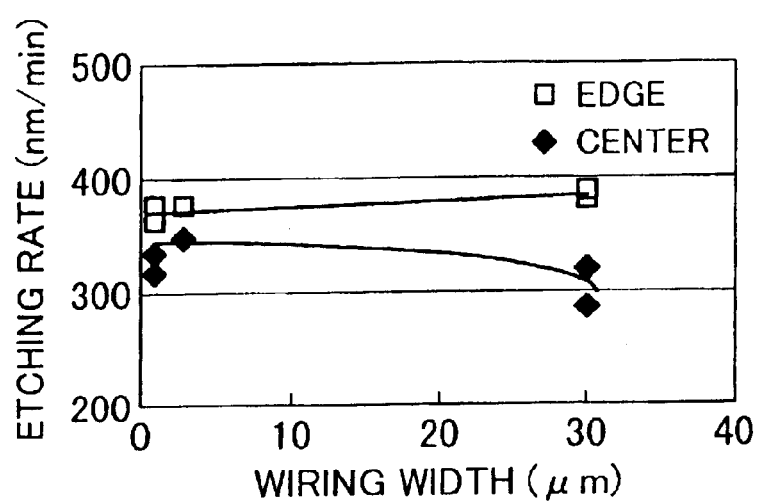
Figure 7B:
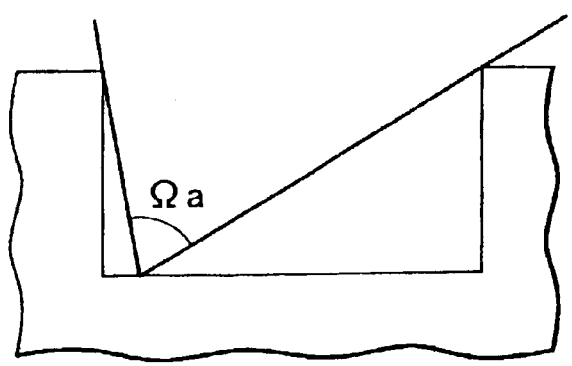
Figure 7C:
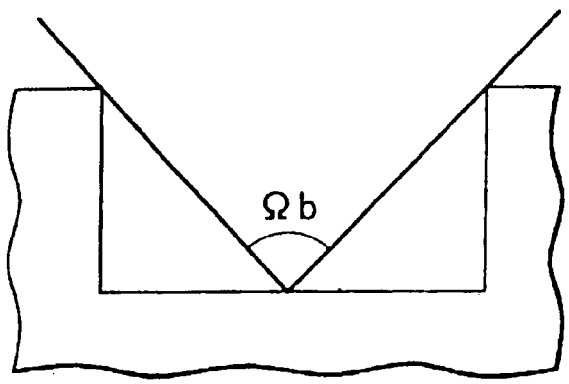
Figure 7D:
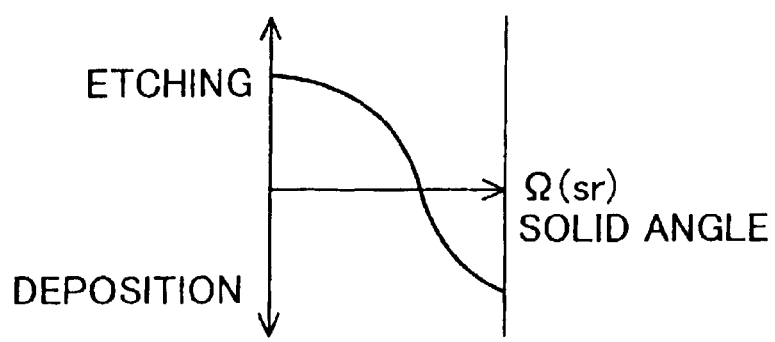

In the description, the remaining pattern of the insulating layer is disposed to form a re-wiring layer on the pad. However, it is also possible to dispose the remaining pattern of the insulating layer in the pad PD and the re-wiring layer rw as shown in FIG. 5I or only in the pad PD as shown in FIG. 5J. The wiring layer in which the remaining pattern is disposed can be arbitrarily selected.

While the present invention has been described with reference to the particular illustrative embodiments, it is not restricted by those embodiments. It will be apparent to those skilled in the art that various alterations, improvements, combinations, etc. can be made.

What is claimed is:

1. A semiconductor device manufacturing method, comprising the steps of:

(a) forming pad lower conductor structure over a semiconductor substrate, said pad lower conductor structure comprising a lower insulating layer and lower via conductors embedded in said lower insulating layer;

(b) forming an insulating stack layer on said pad lower conductor structure, said insulating stack layer including a first insulating layer having an etching characteristic and a second insulating layer having an etching characteristic different from that of said first insulating layer;

(c) forming an etching mask on said insulating stack layer, said etching mask comprising a first portion having an aperture defining a pad region and a second portion disposed in said aperture in the vicinity of at least one of said lower via conductors;

(d) etching said insulating stack layer using said etching mask as a mask to form a pad groove in which said lower via conductors are exposed; and (e) embedding a pad conductor in said pad groove.

2. A semiconductor device manufacturing method according to claim 1, wherein said second portion of said etching mask formed in said step (c) is also selected as to vanish during said step (d).

3. A semiconductor device manufacturing method, comprising the steps of:

(a) preparing a semiconductor structure comprising a semiconductor substrate, a pad conductor over said semiconductor substrate, and an insulating layer surrounding periphery of said conductor;

(b) forming an insulating stack layer on said semiconductor structure, said insulating stack layer including a first insulating layer having an etching characteristic and a second insulating layer having an etching characteristic different from that of said first insulating layer;

(c) forming an etching mask on said insulating stack layer, said etching mask comprising a first portion having an aperture defining a rewiring region and a second portion disposed in said aperture in a selected region of a surface of said pad conductor;

(d) etching said insulating stack layer using said etching mask as a mask to form a re-wiring groove in which said pad conductor is exposed; and (e) embedding a re-wiring conductor in said re-wiring groove.

4. A semiconductor device manufacturing method according to claim 3, wherein said second portion of said etching mask formed in said step (c) is defined to vanish during said step (d).

* * * * *